United States Patent
Lewandowski et al.

(10) Patent No.: US 6,215,313 B1
(45) Date of Patent: Apr. 10, 2001

(54) DIAGNOSTIC METHOD AND APPARATUS FOR DETECTING HIGH ELECTRICAL HARNESS RESISTANCE

(75) Inventors: Edward J. Lewandowski, Scipio; Dennis M. King, Columbus, both of IN (US)

(73) Assignee: Cummins Engine Company, Columbus, IN (US)

( * ) Notice: Subject to any disclaimer, the term of this patent is extended or adjusted under 35 U.S.C. 154(b) by 0 days.

(21) Appl. No.: 09/341,055

(22) PCT Filed: Jan. 14, 1998

(86) PCT No.: PCT/US98/00895

§ 371 Date: Sep. 7, 1999

§ 102(e) Date: Sep. 7, 1999

(87) PCT Pub. No.: WO98/30916

PCT Pub. Date: Jul. 16, 1998

Related U.S. Application Data

(60) Provisional application No. 60/035,200, filed on Jan. 14, 1997.

(51) Int. Cl.$^7$ .................................................. G01R 31/02
(52) U.S. Cl. ........................ 324/503; 324/522; 324/525; 324/538; 324/543
(58) Field of Search .................. 324/378, 503, 324/522, 523, 525, 538, 543

(56) References Cited

U.S. PATENT DOCUMENTS

| | | | |
|---|---|---|---|
| 3,840,782 | 10/1974 | Monaghan | 317/18 |
| 4,207,610 | 6/1980 | Gordon | 364/580 |
| 4,207,611 | 6/1980 | Gordon | 364/580 |
| 4,271,388 | 6/1981 | Schaling | 324/51 |
| 4,523,187 | 6/1985 | Begg | 340/661 |
| 4,689,551 | 8/1987 | Ryan et al. | 324/51 |
| 4,752,959 | 6/1988 | Matsumoto | 381/59 |
| 4,764,727 | 8/1988 | McConchie, Sr. | 324/503 |
| 5,066,919 | 11/1991 | Klassen et al. | 324/538 |
| 5,140,825 | 8/1992 | Hanson et al. | 62/89 |
| 5,392,238 | 2/1995 | Kirisawa | 365/185 |
| 5,530,360 | 6/1996 | Kerchaert et al. | 324/379 |
| 5,578,998 | 11/1996 | Kasprowicz | 340/642 |
| 5,990,570 | * 11/1999 | Yoshida et al. | 324/503 X |

* cited by examiner

*Primary Examiner*—Glenn W. Brown
(74) *Attorney, Agent, or Firm*—Woodard, Emhardt, Naughton, Moriarty & McNett Patent and Trademark Attorneys

(57) ABSTRACT

A method and apparatus for diagnosing excessive resistance in an electrical harness of an internal combustion engine. Voltage is applied from a power source (24) through contacts (30a, 30b, 32a, 32b, 34a, 34b, 36a, 36b) and harness leads (26 and 28) to an electrical assembly (20). Electrical assembly (20) includes the load of a first electrical component (23), and by switching means (25) includes the electrical load of a second electrical component (21). An electronic control module (22 or 38) controls switching means (25) and compares the voltage drop across electrical assembly (20) when the second electrical component (21) is switched in or out. By comparing the voltage drops ECM (22 or 38) can determine if there is excessive resistance in the contacts (30a, 30b, 32a, 32b, 34a, 34b, 36a, 36b) or leads (26 and 28).

34 Claims, 4 Drawing Sheets

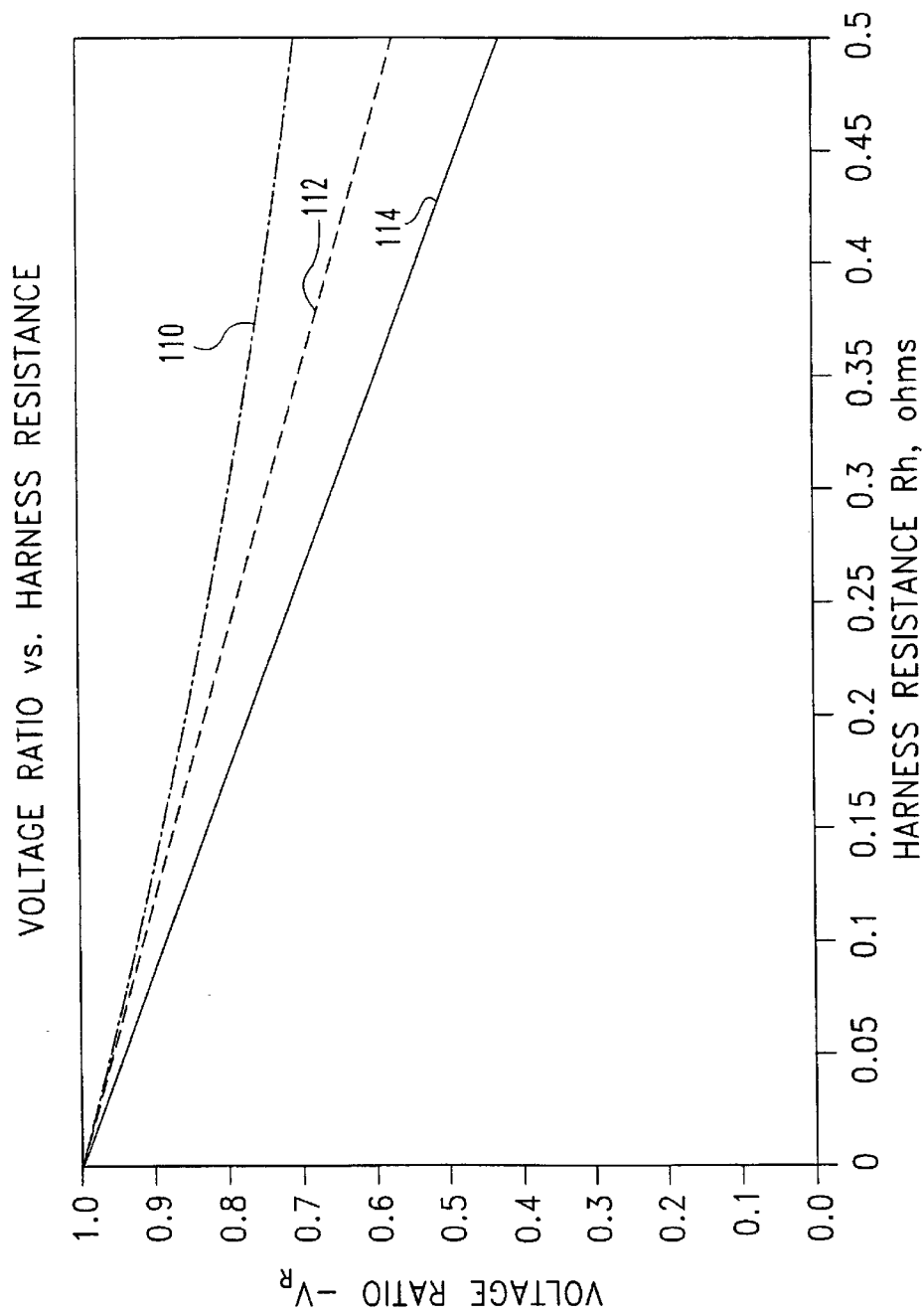

DIAGNOSTIC METHOD AND APPARATUS FOR DETECTING HIGH ELECTRICAL HARNESS RESISTANCE

This application is a 371 of PCT/US98/00895 filed Jan. 14, 1998, and also claims the benefit of Provisional No. 60/035,200 filed Jan. 14, 1997.

BACKGROUND OF THE INVENTION

The present invention relates in general to diagnostic methods for electrical systems which are associated with motor vehicles. More specifically the present invention relates to the use of a switched load within an electrical assembly in order to distinguish between low voltage due to an inadequate power source as compared to low voltage due to a wiring harness problem.

High-current, electronically-controlled assemblies in vehicles require adequate voltage to function properly. An example is a "smart" fuel injection pump which has an on-board electronic control module that controls various solenoids based on various input signals. When the fuel control solenoid is energized, the current draw can range from about 10 amps to 20 amps. If too small a wire is used in the electrical harness, or corrosion increases contact resistance in the harness, the voltage at the fuel injection pump can drop unacceptably low. This can cause fueling problems, timing problems, low power, stalling, and no start. Given today's service environment, this situation can lead to fuel pumps being replaced, when the problem is really with the harness. This results in higher warranty costs and longer service times.

According to the present invention, a diagnostic method is described which can detect unacceptably high harness resistance before symptoms occur.

SUMMARY OF THE INVENTION

One embodiment of the present invention includes providing an internal combustion engine, a first electrical component operable with the engine, a second electrical component operable with the engine, a power supply, an electrical harness for connecting the first electrical component and the second electrical component to the power supply, and a first electronic control module for controlling at least a portion of the engine. The method includes providing electrical power from the power supply through the electrical harness to the first electrical component. A first voltage drop across the first electrical component is measured by the first electronic control module. Electrical power is provided from the power source through the electrical harness in parallel to the first electrical component and to the second electrical component. A second voltage drop across the first electrical component is measured by the first electronic control module. The first voltage drop is compared to the second voltage drop to determine if there is excessive resistance in the electrical harness.

It is an object of the present invention to provide an improved method and apparatus for diagnosing excessive resistance in an electrical harness.

These and other objects of the present invention can be found in the description of the preferred embodiment, the description of the drawings, and the claims to follow.

BRIEF DESCRIPTION OF THE DRAWINGS

FIG. 4 is a diagrammatic representation of the voltage ratio as a function of the harness resistance according to a diagnostic method of the present invention.

DESCRIPTION OF THE PREFERRED EMBODIMENT

Figure 1:
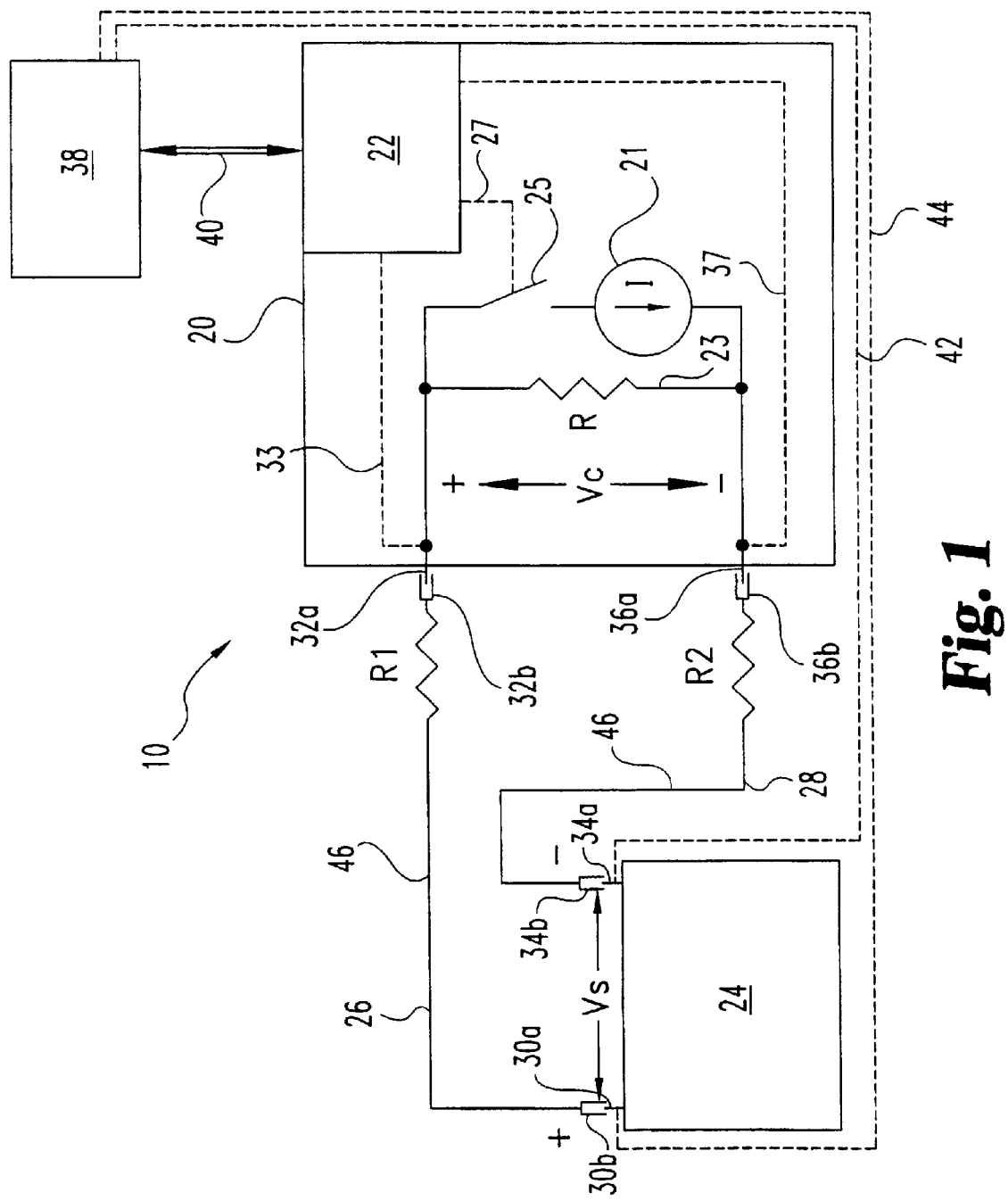
FIG. 1 is a schematic diagram of the circuit to be utilized for the diagnostic method according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The present invention provides an apparatus and a method useful for diagnosing excessive resistance in the electrical harness of an internal combustion engine while the engine is operating. In one embodiment of the present invention an electrical harness connects an electrical power supply to an electrical assembly operable with the engine and configurable between a first electrical load and a second electrical load. In another embodiment of the present invention an electrical harness connects the electrical power source to a first electrical component operable with the engine and to a second electrical component operable with the engine. This embodiment includes means for switching electrical power to the second electrical component. The present invention includes one or more electronic control modules.

FIG. 1 presents a schematic diagram of a circuit to be utilized for the diagnostic method according to the present invention. An electrical assembly 20 useful in the operation of the internal combustion engine is shown schematically. Electrical assembly 20 is operable with the internal combustion engine and is within a portion of the engine such as, by way of example only, the fuel system, exhaust gas recirculation system, ignition system, or various heater systems. Electrical assembly 20 includes with it, preferably internally, a first electrical component 23, depicted schematically as having a resistance value of R, and a second electrical component 21 shown schematically as a current sink which passes a current I when second component 21 is in operation. Components 23 and 21 are both provided electrical power in parallel from a power source 24 through electrical contacts 32a and 36a such that there is a similar voltage drop across each component. The voltage drop across electrical assembly 20 is shown as $V_C$ between contacts 32a and 36a.

In one embodiment of the present invention assembly 20 includes an electronic control module 22 for controlling one or more functions of component 20 preferably in response to operation of the engine. Electronic control module (ECM) 22 is preferably a digital-type controller but may also be an analog controller. ECM 22 may be packaged integrally with assembly 20, or may be located remotely from assembly 20. ECM 22 controls a means 25 capable of repeatedly switching power on and off to second electrical component 21. Switching means 25 includes, by way of example only, an electromagnetic relay, a solid state relay, or one or more transistors. A control line 27 provides a signal for turning power on and off to second component 21 based upon a command from ECM 22. Assembly 20 is thus configurable to a first electrical load by opening switching means 25, the first load being represented by first electrical component 23, and configurable to a second electrical load by closing switching means 25, the second load being represented by first electrical component 23 and second electrical component 21. Signal lines 33 and 37 permit ECM 22 to measure voltage drop $V_C$ across electrical components 23 and 21, which is equivalent to the voltage drop across assembly 20. Because of the parallel connection of electrical power to electrical components 23 and 21, ECM 22 may also measure $V_C$ from a point between components 23 and 21.

Although first electrical assembly 23 has been depicted as having a fixed resistance, and second electrical component 21 has been depicted as a current sink, such depiction and symbology is by way of example only and is not intended to be limiting. For example, first and second electrical components 23 and 21 could each be any combination of resistors, inductors, capacitors, current sinks, integrated circuits, solenoids or other electrical devices. In one embodiment of the present invention electrical assembly 20 is an electronically controlled diesel fuel injection pump, with component 23 schematically and simplistically representing the electrical load presented by an onboard electronic control module and component 21 representing schematically and simplistically the characteristics of a solenoid which is controlled by a current limiting driver.

Power supply 24 provides electrical power to electrical component 20, and may also provide electrical power to other components of the engine. Power supply 24 preferably includes a battery, and may also include an alternator, voltage regulator, circuit breakers, relays, and other components typically used in the power supply of an internal combustion engine. Power supply 24 provides electrical power in the form of a supply voltage $V_S$ through an electrical harness 46 which includes a first harness lead 26 and a second harness lead 28. First harness lead 26 includes an electrical contact 30b that forms an electrical junction with another contact 30a of power source 24. First harness lead 26 includes an electrical contact 32b that forms an electrical junction with a contact 32a of component 20. A similar set of contacts are provided with second harness lead 28, where contacts 34b and 36b of harness lead 28 form electrical junctions with contacts 34a and 36a, respectively, of power source 24 and component 20.

The present invention preferably includes a second electronic control module (ECM) 38 useful in the operation of the internal combustion engine. ECM 38 may provide commands and data to ECM 22 through a datalink 40. In one embodiment of the present invention, electrical assembly 20 is a "smart" fuel injection pump and ECM 38 provides engine timing and fuel requirements through datalink 40 to ECM 22. In other embodiments of the present invention, ECM 38 directly controls switching means 25 through control line 27 and also measures voltage $V_C$ through signal lines 33 and 37. ECM 38 preferably controls other electrical components (not shown) useful in the operation of the internal combustion engine. ECM 38 is preferably a digital-type controller.

The present invention provides a method and apparatus for diagnosing excessive resistance in electrical harness 46 between power source 24 and assembly 20. The resistance of electrical harness 46 includes the resistance in lead wires 26 and 28; the resistance between contacts 30a and 30b; the resistance between contacts 32a and 32b; the resistance between contacts 34a and 34b; and the resistance between contacts 36a and 36b. The resistance of harness leads 26 and 28 may be increased by a variety of factors, including damage or fraying of the lead wires, corrosion, or aging. Resistance between a pair of mating contacts may be increased by a variety of factors, including the presence of dirt, oil, or corrosion between the pair of contacts. Lumped resistance R1 includes the resistance between contacts 30a and 30b, the resistance of lead 26 between and including contact 30b and contact 32b, and the resistance between contacts 32a and 32b. Similarly, lumped resistance R2 represents the resistance between contacts 34a and 34b, he resistance of lead 28 between and including contact 34b and contact 36b, and resistance between contacts 36a and 36b.

In some embodiments of the present invention electrical harness 46 is easily separable from power source 24 and assembly 20. In these embodiments power source 24 and component 20 include electrical connectors which mate with respective mating connectors of electrical harness 46. In these embodiments contacts 30a and 34a represent either pins or sockets of the electrical connector of power source 24, and contacts 30b and 34b represent the mating socket or pin of the mating electrical connector of electrical harness 46. Contacts 32a and 32b and 36a and 36b likewise represent mating connections of pins and sockets. However, in other embodiments of the present invention the contact between the harness and ECM 22 may be "hard wired", such that there is no repeatedly separable connection between harness 46 and power source 24. In yet other embodiments of the present invention the electrical connection between component 20 and harness 46 may be "hard wired."

In the preferred embodiment, power source 24 applies a voltage $V_S$ across contact 30a and 34a. The applied voltage results in current passing through contacts 30a and 30b, harness lead 26, contacts 32a and 32b, through one or both loads 23 and 21 of component 20, contacts 36a and 30b, harness lead 28, and contacts 34a and 34b. The application of voltage $V_S$ results in a voltage drop $V_C$ across contacts 32a and 36a of electrical component 20. The component voltage drop $V_C$ at component 20 is monitored by ECM 22.

Internal to component 20 is a switched load 21 which causes a change in the current provided to assembly 20. In FIG. 1 this is shown as a current sink I which can be switched in. An example of such a component is a solenoid which is controlled by a current limiting driver. Many solenoids, after reaching a pull-in current level, go to a hold current level which is more or less independent of supply voltage. Therefore closing of switching means 25 by ECM 22 results in turning on power to component 21. A current I flows through second electrical component 21 and also through electrical harness 46. However, current I does not flow through first electrical component 23. A different current flows through first electrical component 23. Thus, opening of switching means 25 results in a first, lesser flow of current through electrical harness 46 and contacts 30a–b, 32a–b, 34a–b, and 36a–b as represented by first current level 80 in FIG. 2. Closing of switching means 25 results in a second, higher flow of current through electrical harness 46 and contacts 30a–b, 32a–b, 34a–b, and 36a–b as represented by second current level 82 in FIG. 2. Second current level 82 symbolically represents the addition of first current level 80 through first electrical component 23 and current I through second electrical component 21.

The resistance R represents the minimum operating load of component 20, although the present invention is useful with loads other than the minimum operating load.

This method works with other devices causing a current change through the harness and contacts depending upon whether the electrical component is configured as a first electrical load or as a second electrical load different than the first. The analysis which follows assumes a switched current sink I.

The values of R and I need not be known. They do not need to be fixed. Their tolerances, though, should preferably cause less variation in $V_C$ than the switched current sink causes when $R_1$ and $R_2$ are large.

With the current sink switched out, the voltage $V_C$ is as follows:

$$V_C = \frac{RV_s}{R_h + R}$$

where $$R_h = R_1 + R_2$$

With the current sink switched in, the voltage $V_C$ becomes:

$$V_C = \frac{R(V_s - IR_h)}{R_h + R}$$

Figure 2:
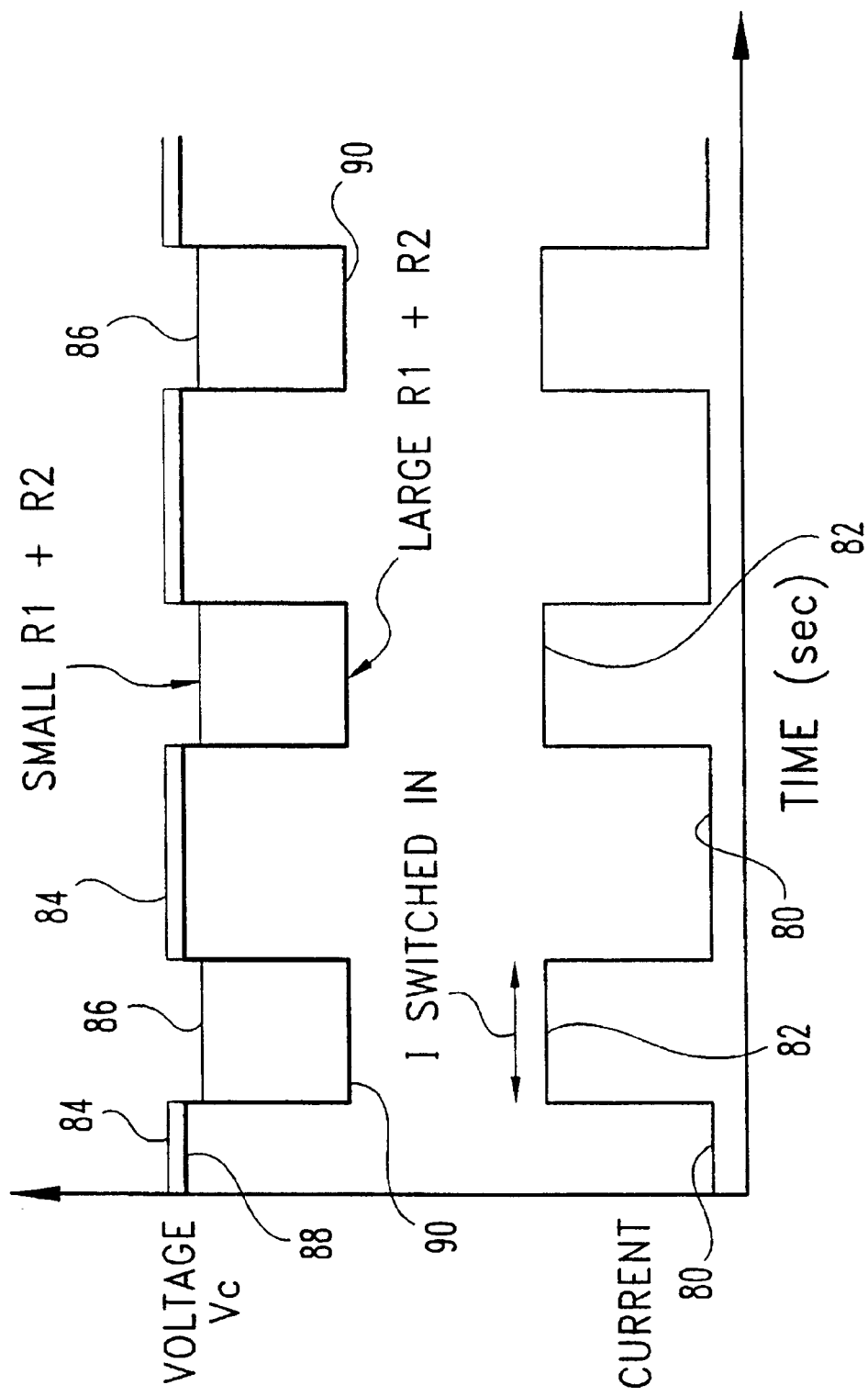
FIG. 2 is a diagrammatic representation of the voltage and current wave forms associated with the diagnostic method of the present invention when a current sink is switched into the circuit.

FIG. 2 shows Voltage $V_C$ as a function of $R_1$ and $R_2$ when I is switched in.

The difference in $V_C$ between when component 21 is switched in and when it is not switched in is represented by delta-$V_C$ in the following equation:

$$\text{delta-}V_C = \frac{R_h RI}{R_h + R}$$

Figure 3:
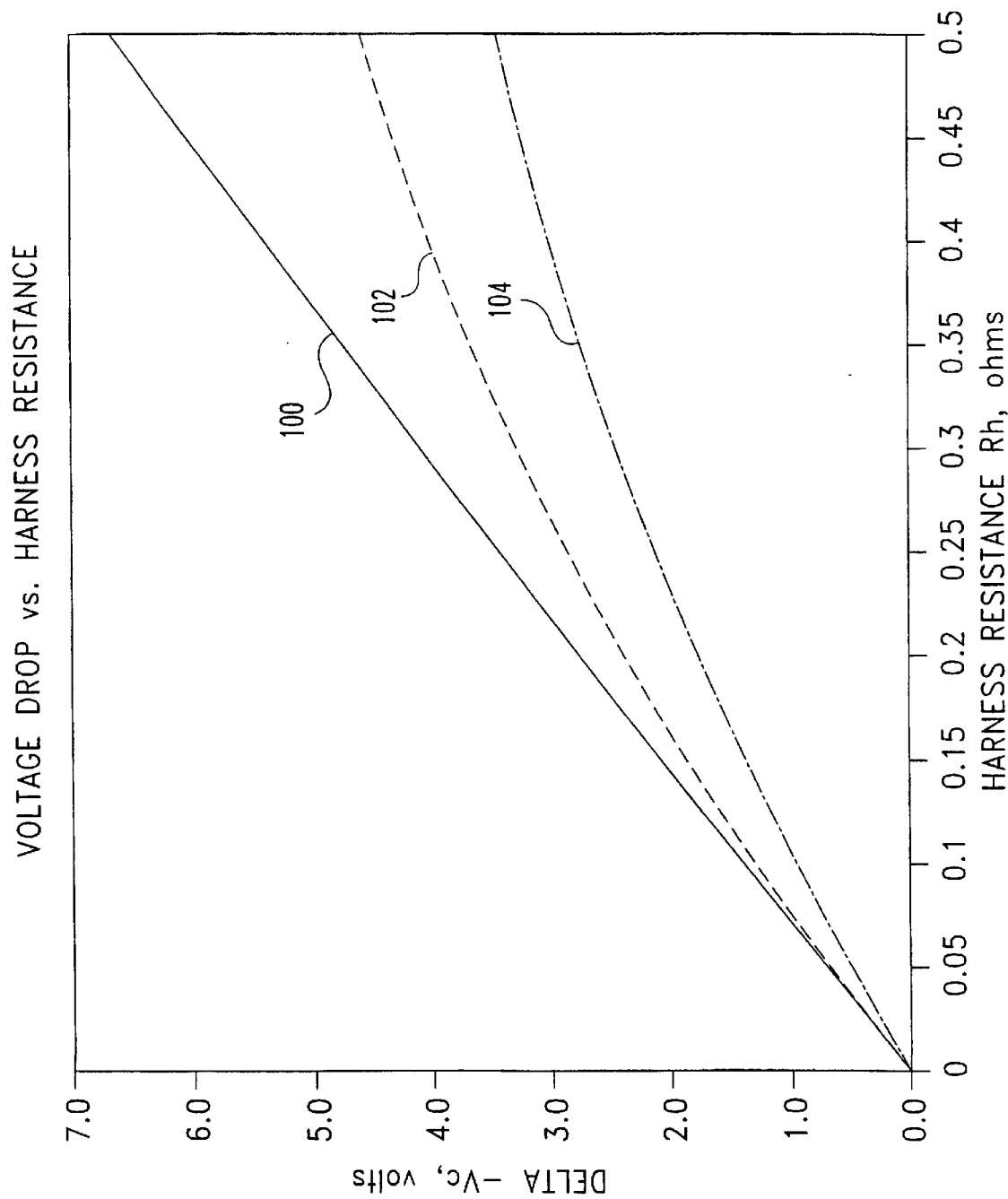
FIG. 3 is a diagrammatic representation of the voltage difference as a function of the harness resistance according to a diagnostic method of the present invention.

Note that delta-$V_C$ is roughly proportional to $R_h$, when $R_h << R$, which is typical. This is desirable, because that means that for small $R_h$, delta-$V_C$ is small. As $R_h$ increases to the point where it causes problems, delta-$V_C$ rapidly increases to identify the high resistance problem. FIG. 3 illustrates this point. FIG. 3 inludes line 100 which shows the relationship between delta-$V_C$ and harness resistance $R_h$. For the assumption made about the load characteristics of second electrical component 21, delta-$V_C$ is independent of $V_S$.

First, consider the voltage drop across component 20 for relatively small harness resistances R1 and R2. The application of electrical power from power supply 24 through electrical harness 46 with switching means 25 open results in a first voltage drop $V_C$ across component 20. This first voltage drop $V_C$ is measured preferably by ECM 22. This first voltage drop $V_C$ is generally depicted as voltage level 84 in FIG. 2. ECM 22 preferably communicates the value of this first voltage drop to ECM 38 via datalink 40. ECM 38 preferably filters the first voltage drop through a low pass filter. ECM 38 preferably records the value of this filtered first voltage drop for later comparison.

ECM 22 then configures electrical assembly 20 to a second electrical load by closing switching means 25. This second electrical load represents the combined loads of first electrical component 23 and second electrical component 21. As a result of providing electrical power from power supply 24 through electrical harness 46 there will be a second voltage drop across assembly 20 which is measured preferably by ECM 22. This second voltage drop is generally depicted as voltage level 86 in FIG. 2. ECM 22 preferably communicates the value of this second voltage drop to ECM 38 via datalink 40. ECM 38 preferably filters the first voltage drop through a low pass filter. ECM 38 preferably compares the filtered first voltage drop to the filtered second voltage drop preferably by subtracting the filtered first voltage drop from the filtered second voltage drop. Because of the small harness resistances R1 and R2 there is a relatively small delta-$V_C$ from voltage level 84 to voltage level 86. From the difference in voltage drops (delta-$V_C$) an equivalent harness resistance $R_h$ can be determined from FIG. 3.

Although the use a first order filter has been described, those of ordinary skill in the art will recognize that other types of digital or analog filters are useful for smoothing the voltage transients. In some embodiments of the present invention, ECM 22 or ECM 38 applies a time delay of about one to two milliseconds before measuring the first or second voltage drop, in order to provide time for the first or second voltage drop to stabilize.

FIG. 2 also illustrates a second situation in which electrical harness 46 has a relatively large resistance R1 and R2. In this second situation the flow of first current level 80 through the larger resistances R1 and R2 results in a lower voltage drop across component 20 when switching means 25 is open. This voltage drop is depicted as voltage level 88 in FIG. 2, which is slightly lower than voltage level 84 because of the higher harness resistance. After closing switching means 25, the second current level 82 flows through electrical harness 46 and the voltage applied across components 23 and 21 is represented by voltage level 90. Because of the increase in harness resistance, voltage level 90 is significantly lower than voltage level 86. The quantity delta-$V_C$ for the case of large harness resistances R1 and R2 is the difference between voltage level 88 and 90, which is a greater difference than between voltage levels 84 and 86 for the case of a low resistance harness. The quantity delta-$V_C$ representing the difference between voltage levels 88 and 90 indicates the presence of large resistance in the electrical harness. One possible diagnostic use of the present invention is to log a fault within ECM 22 or ECM 38 if delta-$V_C$ becomes greater than a calibratable threshold. The first voltage drop $V_C$ and the second voltage drop $V_C$ are preferably compared by ECM 38. By referring to characteristics such as those represented by line 100 of FIG. 3, either ECM 22 or ECM 38 can determine from the comparison of voltage drops if harness 46 has excessive resistance.

In this analysis, an assumption was made about the nature of the switched load as being a fixed current sink. While in the real world no device has these exact characteristics, many devices come close enough to make this diagnostic method viable.

Another device which could be used to model component 21 is a resistor $R_{SW}$ in place of current sink I. With a switched resistor $R_{SW}$, the equation for delta-$V_C$ becomes:

$$\text{delta-}V_C = \frac{(R_h R - R_h R_{sw})V_s}{(R_h + R)(R_h + R_{sw})}$$

Where $R_{SW}$ represents the resistance of the switched resistor ($R_{SW} << R$). With a switched resistor, delta-$V_C$ is no longer proportional only to $R_h$. Delta-$V_C$ is now a function of $V_S$. FIG. 3 shows the effect of $V_S$ where component 21 is modeled with a resistor $R_{SW}$. Line 102 includes a switched resistance of 1 ohm and an applied voltage $V_S$ of 16 volts. Line 104 includes a switched resistance of 1 ohm and an applied voltage $V_S$ of 12 volts. In some embodiments of the present invention where it is preferable to model second electrical component 21 with a non-zero resistance, it may be preferable to include signal lines 42 and 44 for providing means for ECM 38 to measure applied voltage $V_S$ for use in determining if there is excessive harness resistance. Alternatively, signal lines 42 and 44 may be provided to ECM 22. ECM 22 or 38 can determine if harness 46 has excessive resistance by use of the compared voltage drops $V_R$ with FIG. 4.

In another embodiment of the present invention, excessive resistance in harness 46 is detected by comparing component voltage drops and forming a voltage ratio $V_R$. The ratio $V_R$ is formed by dividing the voltage $V_C$ measured when component 20 is configured to the second electrical load by the voltage $V_C$ when component 20 is configured to the first electrical load. The voltage ratio $V_R$ is particularly useful in the case where switched component 21 can be represented as a resistor $R_{SW}$. In that case, the voltage ratio $V_R$ is:

$$V_R = \frac{R_{sw}(R + R_h)}{R(R_h + R_{sw})}$$

For the case in which switched component 21 is represented as a resistance, the voltage ratio $V_R$ is not a function of $V_S$. FIG. 4, depicts the voltage ratio $V_R$ as a function of harness resistance $R_h$. Line 110 represents a case where the switched resistance $R_{SW}$ is 1 ohm. ECM 22 or 38 can determine if harness 46 has excessive resistance by use of the compared voltage drops $V_R$ with FIG. 4.

The voltage ratio $V_R$ is also useful in the case where switched component 21 is represented by a current sink I. With a switched current sink I, the voltage ratio $V_R$ is:

$$V_R = 1 - \frac{IR_h}{V_s}$$

In the case in which switched component 21 is modeled as a current sink I, the voltage ratio $V_R$ is a function of $V_S$. Line 112 in FIG. 4 shows the relationship of $V_R$ to harness resistance for a switched current of 14 amps and an applied voltage $V_S$ of 16 volts. Line 114 of FIG. 4 shows the relationship of $V_R$ to harness resistance when the switched current is 14 amps and $V_S$ is 12 volts. Those of ordinary skill in the art will recognize that the inverse of the voltage ratio $V_R$ is also useful for detecting excessive harness resistance in both cases discussed above.

Some embodiments of the present invention can distinguish a low voltage $V_C$ due to an inadequate power source 24 versus a low voltage $V_C$ due to harness problems. Other embodiments can detect harness resistance problems independent of the supply voltage $V_S$. Thus, it is possible to identify a harness problem while the engine is running, but before it causes symptoms such as preventing the engine from starting.

This method was implemented on an engine at Cummins Engine Company of Columbus, Ind. The engine is equipped with an electronically controlled fuel injection pump. The electronic control module of the fuel injection pump broadcasts two component voltage drops over the datalink: one when the fuel control solenoid is energized, and one when the fuel control solenoid is deenergized. In the engine ECM the difference between these two voltages is calculated. When this difference exceeds a calibratible threshold, a fault is logged. In this embodiment a fault is logged when delta-$V_C$ is greater than about 5.5 volts for a period of about 8 seconds.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method which comprises:
   providing an internal combustion engine, an electrical assembly for the engine wherein the electrical assembly is controlled by a first electronic control module and is configurable between a first electrical load and a second electrical load with the first load being different than the second load, a power source, and an electrical harness for connecting the electrical assembly to the power source;
   configuring the electrical assembly to the first load;
   applying a voltage from the power source through the electrical harness to the electrical assembly;
   measuring a first voltage drop across the electrical assembly;
   configuring the electrical assembly to the second load;
   measuring a second voltage drop across the electrical assembly; and
   comparing the first voltage drop to the second voltage drop.

2. The invention of claim 1 which further comprises determining from said comparing if the harness has excessive resistance.

3. The invention of claim 2 wherein said providing includes a second electronic control module useful for controlling at least a portion of the engine and in electrical communication with the first electronic control module, and said determining is performed by the second electronic control module.

4. The invention of claim 2 wherein said determining includes measuring the applied voltage.

5. The invention of claim 1 wherein said configuring to the first load is controlled by the first electronic control module, and said configuring to the second load is controlled by the first electronic control module.

6. The invention of claim 1 wherein the second load includes a solenoid.

7. The invention of claim 1 wherein the power source includes a battery.

8. The invention of claim 1 wherein the electrical assembly is a fuel injection pump.

9. The invention of claim 1 wherein said comparing includes subtracting the first voltage drop from the second voltage drop.

10. The invention of claim 1 wherein said comparing includes dividing the second voltage drop by the first voltage drop.

11. A method which comprises:
    providing an internal combustion engine, a first electrical component for the engine, a second electrical component for the engine, a power source, an electrical harness for connecting the first electrical component and the second electrical component to the power source, and a first electronic control module for controlling at least a portion of the engine;
    providing electrical power from the power source through the electrical harness to the first electrical component;
    measuring a first voltage drop across the first electrical component, said measuring being performed by the first electronic control module;

providing electrical power from the power source through the electrical harness in parallel to the first electrical component and to the second electrical component;

measuring a second voltage drop across the first electrical component, said measuring being performed by the first electronic control module; and comparing the first voltage drop to the second voltage drop.

12. The invention of claim 11 wherein said comparing is performed by the first electronic control module.

13. The invention of claim 11 which further comprises determining from said comparing if the electrical harness has excessive resistance.

14. The invention of claim 13 wherein said determining is performed by the first electronic control module.

15. The invention of claim 13 wherein said determining includes measuring the applied voltage.

16. The invention of claim 11 wherein said providing an internal combustion engine includes a second electronic control module for controlling at least a portion of the engine, and said comparing is performed by the second electronic control module.

17. The invention of claim 16 which further comprises determining from said comparing if the electrical harness has excessive resistance, and said determining is performed by the second electronic control module.

18. The invention of claim 17 wherein said determining includes measuring the provided voltage.

19. The invention of claim 11 wherein the power source includes a battery.

20. The invention of claim 11 wherein the second electrical component includes a solenoid.

21. The invention of claim 11 wherein said comparing includes subtracting the first voltage drop from the second voltage drop.

22. The invention of claim 11 wherein said comparing includes dividing the second voltage drop by the first voltage drop.

23. An apparatus which comprises:

an internal combustion engine;

an electronic control module operating at least a portion of said internal combustion engine;

a first electrical component useful in the operation of said internal combustion engine;

a second electrical component useful in the operation of said internal combustion engine;

an electrical power source;

an electrical harness for providing electrical power from said power source in parallel to said first electrical component and said second electrical component, said electrical harness having a resistance; and means for repeatedly switching power on and off to said second electrical component;

wherein there is a first voltage drop across said first electrical component when power to said second electrical component is off, a second voltage drop across said first electrical component when power to said second electrical component is on, and said electronic control module determines if there is excessive resistance in said electrical harness by comparing the first voltage drop to the second voltage drop.

24. The apparatus of claim 23 wherein said second electrical component is a solenoid.

25. The apparatus of claim 23 wherein said first electrical component and said second electrical component are part of a fuel injection pump.

26. A method which comprises:

providing an internal combustion engine, an electrical assembly for the engine wherein the electrical assembly includes a first internal electrical component and a second internal electrical component, a power source, an electrical harness for providing electrical power from the source to the first internal electrical component, a means for switching electrical power to the second internal electrical component, and a first electronic control module for operating a portion of the engine and controlling the switching means;

applying a voltage from the power source through the electrical harness to the first internal electrical component;

measuring a first voltage drop across the first internal electrical component;

switching power on by the switching means to the second internal electrical component, said switching being controlled by the first electronic control module in response to operation of the engine;

measuring a second voltage drop across the first internal electrical component or the second internal electrical component; and comparing the first voltage drop to the second voltage drop.

27. The invention of claim 26 which further comprises determining from said comparing if the harness has excessive resistance.

28. The invention of claim 27 wherein said determining includes measuring the applied voltage.

29. The invention of claim 26 wherein said providing includes a second electronic control module useful for controlling at least a portion of the engine and in electrical communication with the first electronic control module, and said determining is performed by the second electronic control module.

30. The invention of claim 26 wherein the second internal electrical component is a solenoid.

31. The invention of claim 26 wherein the first internal electrical component includes the first electronic control module.

32. The invention of claim 26 wherein the electrical assembly is a fuel injection pump.

33. The invention of claim 26 wherein said comparing includes subtracting the first voltage drop from the second voltage drop.

34. The invention of claim 26 wherein said comparing includes dividing the second voltage drop by the first voltage drop.

* * * * *